(12) United States Patent
Li

(10) Patent No.: US 8,905,224 B2
(45) Date of Patent: Dec. 9, 2014

(54) CLAMPING MECHANISM AND CARRYING DEVICE AND TRANSFERRING APPARATUS WITH THE SAME

(75) Inventor: Dong Li, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 13/811,123

(22) PCT Filed: Sep. 11, 2012

(86) PCT No.: PCT/CN2012/081259
§ 371 (c)(1),
(2), (4) Date: Jan. 18, 2013

(87) PCT Pub. No.: WO2014/015553
PCT Pub. Date: Jan. 30, 2014

(65) Prior Publication Data
US 2014/0027245 A1 Jan. 30, 2014

(30) Foreign Application Priority Data
Jul. 24, 2012 (CN) .......................... 2012 2 0360584

(51) Int. Cl.
*B25J 15/00* (2006.01)
*H01L 21/687* (2006.01)
*H01L 21/677* (2006.01)

(52) U.S. Cl.
CPC ........ *H01L 21/677* (2013.01); *H01L 21/68707* (2013.01); *B25J 15/0028* (2013.01)
USPC .................. 198/468.2; 198/803.7; 198/867.05

(58) Field of Classification Search
CPC ...... B65G 47/901; B23Q 7/04; B23Q 7/1494; B25J 15/0028
USPC ........ 198/468.01, 468.2, 626.4, 626.6, 803.7, 198/867.05
See application file for complete search history.

(56) References Cited

U.S. PATENT DOCUMENTS

| 3,934,702 A * | 1/1976 | Snyder et al. ................. 503/211 |
| 4,349,112 A * | 9/1982 | Wilks et al. ................... 209/538 |
| 4,684,309 A * | 8/1987 | Horn et al. .................... 221/242 |
| 6,674,037 B2 * | 1/2004 | Ruigrok et al. ................ 209/577 |
| 7,278,531 B2 * | 10/2007 | Hartness et al. ........... 198/470.1 |
| 7,578,610 B2 | 8/2009 | Sakamoto et al. |

FOREIGN PATENT DOCUMENTS

| CN | 1733577 | 2/2006 |
| CN | 102155691 | 8/2011 |
| CN | 202053247 | 11/2011 |
| JP | 8321541 | 12/1996 |

* cited by examiner

*Primary Examiner* — Leslie A Nicholson, III
(74) *Attorney, Agent, or Firm* — Sand & Sebolt

(57) ABSTRACT

The present disclosure provides a clamping mechanism for clamping a liquid crystal panel of a LCD, the clamping mechanism includes a base, a clamping member mounted on the base, and an elastic member connected to the base and applying a drawing force onto the clamping member to allow the clamping member under balanced outer force. With the clamping mechanism, the vertical position of the clamping mechanism can be adjusted as the height of the liquid crystal panel changes, thus, the clamping member can be kept coplanar with the liquid crystal panel, to avoid the fracture of the liquid crystal panel; meanwhile, with the elastic member, the frequency and the precision of adjusting the clamping mechanism can be decreased to reduce the maintaining cost of the clamping mechanism. The present disclosure further provides a carrying device and a transferring apparatus with the clamping mechanism.

6 Claims, 2 Drawing Sheets

CLAMPING MECHANISM AND CARRYING DEVICE AND TRANSFERRING APPARATUS WITH THE SAME

CROSS-REFERENCE TO RELATED APPLICATIONS

This application is a National Stage Entry of PCT/CN2012/081259, having an international filing date of Sep. 11, 2012, which application claims priority from Chinese Patent Application No. 201220360584.X, filed Jul. 24, 2012.

BACKGROUND

1. Technical Field

The present disclosure relates to liquid crystal displaying technologies and, particularly, to a clamping mechanism for clamping a liquid crystal panel during the process of manufacturing the liquid crystal panel and a carrying device and a transferring apparatus having the champing mechanism.

2. Description of Related Art

In the manufacturing process of a liquid crystal panel, a transferring apparatus is often used for transferring the liquid crystal panel to a predetermined location. As shown in FIG. 1, the present transferring apparatus 80 generally includes a clamping member 81 for clamping an edge of the liquid crystal panel 90, a number of rollers 82 arranged side by side, and a cylinder 83 for driving the clamping member 81 to move vertically. After the liquid crystal panel 90 is placed on the rollers 82, the cylinder 83 drives the clamping member 81 to move upwards to correspond to the liquid crystal panel 90, thereby allowing the clamping member 81 to clamp the liquid crystal panel. After the liquid crystal panel 90 is clamped in the clamping member 81 and the liquid crystal panel 90 is transferred by the rollers 82 to the predetermined location, the clamping member 81 unclamps the liquid crystal panel 90 to allow the liquid crystal panel 90 to enter into the following manufacturing process.

Before using the transferring apparatus 80 to clamp the liquid crystal panel 90, the clamping member 81 is adjusted so that after the liquid crystal panel 90 is placed on the rollers 82, the clamping member 81 can be coplanar with the liquid crystal panel 90. In this way, the internal stress of the corresponding edge of the liquid crystal panel 90 clamped in the clamping member 81 can be kept in bearable extent, even zero, preventing the liquid crystal panel 90 from being cracked. However, in practical situation, heights of the rollers 82 may be varied, causing the liquid crystal panel 90 placed on the rollers 82 to move upwards or downwards when being transferred. On the other hand, the height of the clamping member 81 has been fixed, making it impossible for the clamping member 81 to keep coplanar with the liquid crystal panel 90. Thus, after the clamping member 81 clams the edge of the liquid crystal panel, since the clamping member 81 is not coplanar with the liquid crystal panel 90, the edge of the liquid crystal panel 90 clamped by the clamping member 81 bears stress from the clamping member 81, resulting in the fracture of the liquid crystal panel 90. Since the cylinder 83 is designed to move up and down for a fixed distance and the moving distance of the clamping member 81 is determined by the cylinder 83, therefore, the height of the clamping member 81 cannot be adjusted by controlling the cylinder 83 to be the same as that of the liquid crystal panel 90. Thus, the transferring apparatus 80 needs to be adjusted and measured manually, which increases the maintaining cost.

SUMMARY

The present disclosure provides a clamping mechanism for clamping a liquid crystal panel and further preventing the liquid crystal panel from being cracked by the clamping mechanism and more further reducing the maintaining cost of the clamping mechanism.

The clamping mechanism includes a base, a clamping member mounted on the base, and an elastic member secured to the base and applying a drawing force onto the clamping member to allow the clamping member to bear balanced outer force.

Preferably, the elastic member is vertically configured with one end thereof secured to the base and the other end thereof secured to the clamping member.

Preferably, the clamping mechanism includes a pulley secured to the base, one end of the elastic member is secured to the base and the other end thereof is connected to a connecting rope, and the connecting rope wraps around the pulley to be connected to the clamping member.

Preferably, the base defines a hole, the clamping mechanism further includes an adjusting device, the adjusting device includes a screw and a nut; one end of the screw is connected to the elastic member and the other end thereof passes through the hole; and the nut is secured to the nut and abuts the base.

Preferably, the clamping mechanism includes a connecting member and a guiding member, the connecting member is arranged between the elastic member and the clamping member, the guiding member is arranged between the connecting member and the base for guiding the connecting member and the clamping member to move vertically.

Preferably, the guiding member includes a slot and a protrusion, the protrusion is arranged on the connecting member and the slot is defined in the base for receiving the slot; or the protrusion is arranged on the base and the slot is defined in the connecting member for receiving the protrusion.

The present disclosure further provides a carrying device. The carrying device includes a clamping mechanism and a driving member connected to the clamping mechanism for driving the clamping mechanism to move. The clamping mechanism includes a base, a clamping member mounted on the base; and an elastic member arranged on the base for applying a drawing force onto the clamping member to allow the clamping member to bear balanced outer force.

Preferably, the carrying device further includes a bottom portion, and the driving member is arranged on the bottom portion and located between the clamping mechanism and the bottom portion.

Preferably, the elastic member is vertically configured, and one end of the elastic member is fixed to the base and the other end thereof is fixed to the clamping member.

Preferably, the clamping mechanism further includes a pulley fixed to the base, one end of the elastic member is fixed to the base and the other end thereof is connected to a connecting rope, and the connecting rope wraps around the pulley to be connected to the clamping member.

Preferably, the clamping mechanism further includes an adjusting device, the adjusting device includes a screw and a nut; the base defines a hole; one end of the screw is connected to the elastic member and the other end thereof passes through the hole; and the nut is fixed to the screw and abuts the base.

Preferably, the clamping mechanism further includes a connecting member and a guiding member, the connecting member is arranged between the elastic member and the clamping member, and the guiding member is arranged between the connecting member and the base for guiding the connecting member and the clamping member to move vertically.

Preferably, the guiding member includes a slot and a protrusion, the protrusion/the slot is disposed on the connecting member and the slot/the protrusion is correspondingly disposed in the base, and the protrusion is received in the slot.

The present disclosure also provides a transferring apparatus used for transferring a liquid crystal panel. The transferring apparatus includes rollers for supporting the liquid crystal panel and a carrying device. The carrying device includes a clamping mechanism and a driving member connected to the clamping mechanism for driving the clamping mechanism to move. The clamping mechanism includes a base, a clamping member mounted on the base, and an elastic member connected to the base. The elastic member is in stretched state when there is no vertical interaction force between the liquid crystal panel and the clamping member, thereby applying a drawing force equal to a gravity of the clamping member onto the clamping member.

Preferably, when the liquid crystal panel applies a downward force onto the clamping member, the clamping member applies a vertically-downward force onto the elastic member to enlarge the deformation of the elastic member; when the liquid crystal panel applies an upward force onto the clamping member, the clamping member decreases the drawing force applied onto the elastic member to decrease the deformation of the elastic member.

Preferably, the elastic member is vertically configured with one end thereof connected to the base and the other end thereof connected to the clamping member.

Preferably, the clamping mechanism further includes a pulley connected to the base, one end of the elastic member is connected to the base and the other end thereof is connected to a connecting rope, and the connecting rope wraps around the pulley to be connected to the clamping member.

Preferably, the clamping mechanism further includes an adjusting device, the adjusting device includes a screw and a nut; the base defines a hole; one end of the screw is connected to the elastic member and the other end thereof passes through the hole; and the nut is connected to the screw and abuts the base.

Preferably, the clamping mechanism further includes a connecting member and a guiding member, the connecting member is arranged between the elastic member and the clamping member, and the guiding member is arranged between the connecting member and the base for guiding the connecting member and the clamping member to move vertically.

Preferably, the guiding member includes a slot and a protrusion, the protrusion is disposed on the connecting member and the slot is defined in the base for receiving the protrusion, or the protrusion is disposed on the base and the slot is defined in the connecting member for receiving the protrusion.

With the elastic member, the vertical position of the clamping member can be adjusted as the height of the liquid crystal panel changes. Therefore, during the process of transferring the liquid crystal panel, when the clamping member is not coplanar with the liquid crystal panel due to the movement of the rollers or other components of the transferring apparatus or due to the changes of the heights of the rollers, the clamping member can still move to be coplanar with the liquid crystal panel by the elastic member and bears balanced outer force, thereby allowing the internal stress of the liquid crystal panel to be kept in bearable extent and avoiding the fracture of the liquid crystal panel. Meanwhile, with the configuration of the elastic member, the frequency and the precision of adjusting the clamping mechanism can be decreased to reduce the maintaining cost of the transferring apparatus.

DESCRIPTION OF THE DRAWINGS

Many aspects of the embodiments can be better understood with reference to the following drawings. The components in the drawings are not necessarily dawns to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment is this disclosure are not necessarily to the same embodiment, and such references mean at least one.

Figure 1:
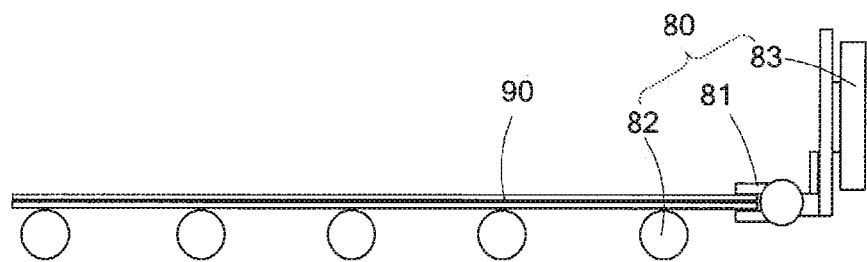
FIG. 1 is a schematic view showing a present transferring apparatus for transferring a liquid crystal panel of a liquid crystal device.
Figure 2:
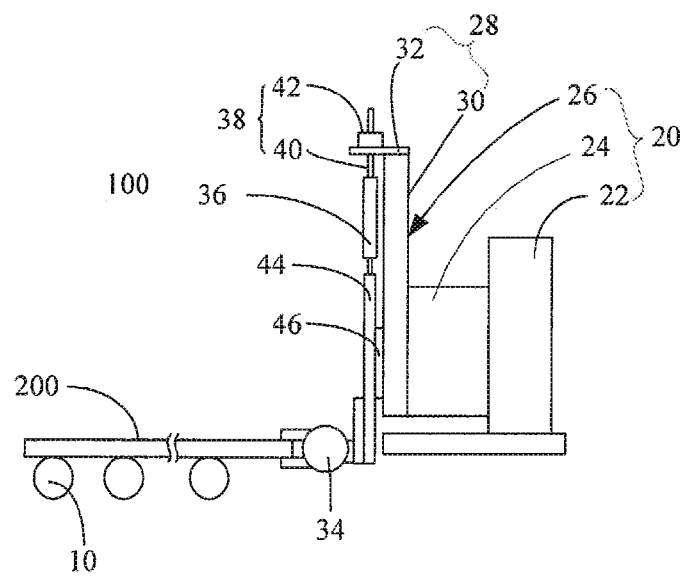
FIG. 2 is a side view of a transferring apparatus in accordance with an embodiment of the present disclosure used for transferring a liquid crystal panel.

Referring to FIG. 2, a transferring apparatus 100 in accordance with an embodiment of the present disclosure is used for transferring a liquid crystal panel 200 to a predetermined location. The transferring apparatus 100 includes a number of rollers 10 arranged side by side for supporting the liquid crystal panel 200 and a carrying device 20 for driving the liquid crystal panel 200 to move on the rollers 10. The carrying device 20 includes a bottom portion 22, a clamping mechanism 26 for clamping the liquid crystal panel 200, and a driving member 24 arranged on the bottom portion 22 and located between the bottom portion 22 and the clamping mechanism 26. In the embodiment, the driving member 24 may be a cylinder, a motor, or combination of a motor and gear, which is used for driving the clamping mechanism 26 to move upwards and downwards. The clamping mechanism 26 includes a base 28 connected to the driving member 24, a clamping member 34, and an elastic member 36. The elastic member 36 may be a spring or a rubber-made object which is deformed under outer force to keep the clamping member 34 to be substantially coplanar with the liquid crystal panel 200.

Preferably, the base 28 includes a connecting plate 30 secured to the driving member 24 and a fixing plate 32 secured to the connecting plate 30. One end of the elastic member 36 is fixed to the fixing plate 32 and the other end thereof is fixed to the clamping member 34.

Figure 3:
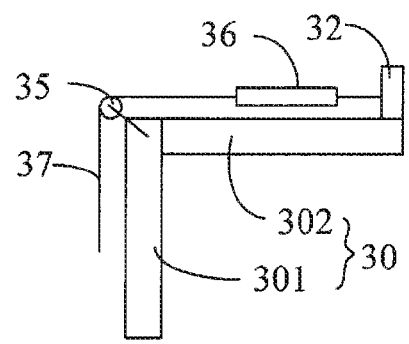
FIG. 3 is a schematic view of a horizontally-configured elastic member in accordance with a second embodiment of the transferring apparatus of the present disclosure.

As the embodiment shown in FIG. 2, the elastic member 36 is vertically configured. But it is noted that in other embodiments, the elastic member 36 can be horizontally configured or slantedly configured. Referring to FIG. 3, the elastic member of the transferring apparatus, in accordance with a second embodiment, is horizontally configured. In the second embodiment, the connecting plate 30 includes a fixing portion 301 connected to the driving member (not shown in FIG. 3) and a connecting portion 302 connected to the fixing portion 301. The fixing plate 32 is arranged on a distal end of the connecting portion 302. A pulley 35 is disposed on the connecting portion of the fixing portion 301 and the connecting portion 302. The elastic member 36 is arranged in this way that one end thereof is secured to the fixing plate 32 and the other end thereof is connected to a connecting rope 37. The connecting rope 37 wraps around the pulley 35 to be connected to the clamping member (not shown in FIG. 3). In FIG.

3, the fixing portion 301 and the connecting portion 302 form a right angle of 90 degrees, allowing the elastic member 36 to be horizontally configured. In other embodiments, the configuration of the elastic member 36 can be modified by changing the angle formed between the fixing portion 301 and the connecting portion 302, which eases the design of the transferring apparatus 100.

Preferably, the clamping mechanism 26 further includes an adjusting device 38 arranged between the elastic member 36 and the base 28. Specifically, the adjusting device 38 includes a screw 40 and a nut 42. The screw 40 is connected to the elastic member 36 by passing through a hole defined in the fixing plate 32. The nut 42 is connected to the screw 40 and abuts the fixing plate 32. The elastic member 36 and the nut 42 are respectively located at two sides of the fixing plate 32. When the nut 42 is rotated, the distance between the elastic member 36 and the fixing plate 32 is adjusted, thereby adjusting the position of the elastic member 36 and the position of the clamping member 34 relative to the fixing plate 32.

Figure 4:
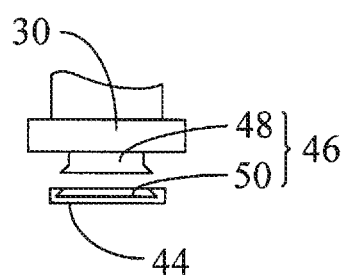
FIG. 4 is a partially cross-sectional view of the transferring apparatus of FIG. 2.

Preferably, the clamping mechanism 26 further includes a connecting member 44 and a guiding member 46. One end of the connecting member 44 is connected to the elastic member 36 and the other end thereof is connected to the clamping member 34. The guiding member 46 is disposed between the connecting member 44 and the base 28. Specifically, as shown in FIG. 4, the guiding member 46 includes a protrusion 48 and a slot 50. The protrusion 48 is arranged on the connecting plate 30 and the slot 50 is defined in the connecting member 44 for receiving the protrusion 48. When the clamping member 34 moves upwards and downwards, the guiding member 46 is capable of preventing the clamping member 34 from moving relative to the base 28 horizontally, thereby ensuring the position of the clamping member 34 to change as the position of the liquid crystal panel 200 changes. However, it is understood that the slot 50 may be defined in the connecting plate 30 and the protrusion 48 may be correspondingly arranged on the connecting member 44. Similarly, the protrusion 48 and the slot 50 can be properly shaped, for example, wedge shaped.

When using the transferring apparatus 100 to transfer the liquid crystal panel 200, the driving member 24 drives the clamping mechanism 26 to move vertically until the clamping mechanism 26 substantially corresponds to the liquid crystal panel 200. After the clamping mechanism 26 clamps the corresponding edge of the liquid crystal panel 200, the carrying device 20 is driven to move horizontally for a predetermined distance, thereby transferring the liquid crystal panel 200 to the predetermined location. During the process, if the liquid crystal panel 200 is coplanar with the clamping mechanism 34, the elastic member 36 is stretched to apply an elastic force equal to the gravity of the clamping member 34 onto the clamping mechanism 34. In this way, the outer force applied to the clamping mechanism 34 keeps balanced, which prevents the clamping member 34 from applying an outer force onto the edge clamped thereby and further avoids the deformation of the liquid crystal panel 200.

When the liquid crystal panel 200 is not coplanar with the clamping member 34 due to the varied heights of the rollers 10 or other reasons, for example, when the plane in which the clamping member 34 lies is higher than of the plane in which the liquid crystal panel 200 lies due to the situation where the liquid crystal panel 200 is lower than the clamping member 34, the liquid crystal panel 200 applies a downward force onto the clamping member 34, driving the clamping member 34 to move downwards to be coplanar with the liquid crystal panel 200. This enlarges the deformation of the elastic member 36 and the elastic member 36 correspondingly applies a greater drawing force onto the clamping member 34, making the outer force applied onto the clamping member 34 be balanced again. In this way, the clamping member 34 can be prevented from applying an outer force on the edge of the liquid crystal panel 200 clamped thereby to avoid the deformation of the liquid crystal panel 200. On the other hand, when the liquid crystal panel 200 is higher than the clamping member 34, that is, the plane in which the clamping member 34 lies is lower than the plane in which the liquid crystal panel 200 lies, the liquid crystal panel 200 applies an upward force onto the clamping member 34, driving the clamping member 34 to move upwards to be coplanar with the liquid crystal panel 200. During the process, due to the upward force applied to the clamping member 34, the drawing force applied onto the elastic member 36 from the clamping member 34 becomes less to decrease the deformation of the elastic member 36. In this way, the drawing force applied onto the clamping member 34 from the elastic member 36 correspondingly becomes less, allowing the clamping member 34 to bear balanced force. Therefore, the clamping member 34 is prevented from applying an outer force onto the edge of the liquid crystal panel 200 clamped thereby, which avoids the deformation of the liquid crystal panel 200.

Therefore, with the elastic member 36, the clamping member 34 can be kept coplanar with the liquid crystal panel 200, which avoids the fracture of the liquid crystal panel 200. Additionally, when adjusting the clamping mechanism 26, the clamping member 34 is not required to adjusted to precisely correspond to the liquid crystal panel 200, therefore, the configuration of the elastic member 36 decreases the precision and frequency of adjusting the clamping mechanism 26. Furthermore, the height of the clamping member 34 can also be adjusted by adjusting the relative position between the screw 40 and the nut 42, which further eases the adjustment of the transferring apparatus 100.

The clamping mechanism 26 of the present disclosure, with the elastic member 36 connected to the clamping member 34, the height of the clamping member 34 can be adjusted according to the height of the liquid crystal panel 200. Therefore, during the process of transferring the liquid crystal panel 200, when the clamping member 34 is not coplanar with the liquid crystal panel 200 due to the movement of the rollers 10 or other components of the transferring apparatus or due to the changes of the heights of the rollers 10, the clamping member 34 can still move to be coplanar with the liquid crystal panel 200 by the elastic member 36 and bears balanced outer force, thereby allowing the internal stress of the liquid crystal panel 200 to be kept in bearable extent and avoiding the fracture of the liquid crystal panel 200. Meanwhile, the configuration of the elastic member 36 can decrease the frequency and the precision of adjusting the transferring apparatus 100, and the maintaining cost of the transferring apparatus thus is reduced. Additionally, with the adjusting device 38, the height of the clamping member 34 can be adjusted by adjusting the relative position between the screw 40 and the nut 42, which eases the adjustment of the clamping member 34. Furthermore, with the guiding member 46, the clamping member 34 can be prevented from moving relative to the base 28 horizontally, which further ensures the position of the clamping member 34 to be changed as the position of the liquid crystal panel 200 changes.

Even though information and the advantages of the present embodiments have been set forth in the foregoing description, together with details of the mechanisms and functions of the present embodiments, the disclosure is illustrative only; and that changes may be made in detail, especially in matters of shape, size, and arrangement of parts within the principles of the present embodiments to the full extend indicated by the broad general meaning of the terms in which the appended claims are expressed.

What is claimed is:

1. A carrying device, comprising:
   a clamping mechanism, comprising:
      a base;
      a clamping member mounted on the base; and
      an elastic member arranged on the base for applying a drawing force onto the clamping member to allow the clamping member to bear balanced outer force; and
   a driving member connected to the clamping mechanism for driving the clamping mechanism to move;
   a connecting member arranged between the elastic member and the clamping member; and
   a guiding member arranged between the connecting member and the base for guiding the connecting member and the clamping member to move vertically.

2. The carrying device as claimed in claim 1, wherein the carrying device further comprises a bottom portion, and the driving member is arranged on the bottom portion and located between the clamping mechanism and the bottom portion.

3. The carrying device as claimed in claim 1, wherein the elastic member is vertically configured, and one end of the elastic member is fixed to the base and the other end thereof is fixed to the clamping member.

4. The carrying device as claimed in claim 1, wherein the clamping mechanism further comprises a pulley fixed to the base, one end of the elastic member is fixed to the base and the other end thereof is connected to a connecting rope, and the connecting rope wraps around the pulley to be connected to the clamping member.

5. The carrying device as claimed in claim 1, wherein the clamping mechanism further comprises an adjusting device, the adjusting device comprises a screw and a nut; the base defines a hole; one end of the screw is connected to the elastic member and the other end thereof passes through the hole; and the nut is fixed to the screw and abuts the base.

6. The carrying device as claimed in claim 1, wherein the guiding member comprises a slot and a protrusion, the protrusion/the slot is disposed on the connecting member and the slot/the protrusion is correspondingly disposed in the base, and the protrusion is received in the slot.

* * * * *